United States Patent [19]

Mueller et al.

[11] Patent Number: 4,540,464
[45] Date of Patent: Sep. 10, 1985

[54] METHOD OF RENEWING DEFECTIVE COPPER CONDUCTORS ON THE EXTERNAL PLANES OF MULTILAYER CIRCUIT BOARDS

[75] Inventors: Harald Mueller, Grafenau; Friedrich Schwerdt, Herrenberg, both of Fed. Rep. of Germany

[73] Assignee: International Business Machines Corporation, Armonk, N.Y.

[21] Appl. No.: 605,082

[22] Filed: Apr. 30, 1984

[30] Foreign Application Priority Data

May 19, 1983 [EP] European Pat. Off. ......... 831049572

[51] Int. Cl.³ .............................. C23F 1/02; B44C 1/22; C23C 15/00; B05D 5/12
[52] U.S. Cl. ..................................... 156/639; 29/852; 134/3; 134/28; 134/29; 156/644; 156/656; 156/666; 156/667; 156/902; 174/68.5; 204/24; 204/32.1; 204/192 C; 204/38.4; 427/97
[58] Field of Search .................. 252/79.2; 204/24, 30, 204/38 S, 32 R, 192 C, 192 EC; 29/575, 852-853; 134/3, 41, 28, 29; 174/68.5; 427/97; 156/639, 656, 644, 630, 666, 667, 901, 902

[56] References Cited

U.S. PATENT DOCUMENTS

| | | | |
|---|---|---|---|
| 3,702,284 | 11/1972 | Merkenschlayer | 204/15 |
| 3,717,520 | 2/1973 | Brindisi | 156/656 |
| 3,923,567 | 12/1975 | Lawrence | 156/657 X |
| 4,418,264 | 11/1983 | Thorwarth | 219/78.01 |

Primary Examiner—William A. Powell
Attorney, Agent, or Firm—Marilyn D. Smith; Max J. Kenemore; Jesse L. Abzug

[57] ABSTRACT

After cleaning and removal of oxidic layers, the defective copper conductors are completely etched off the surface of the external planes of a multilayer circuit board, and the copper on the walls of the plated through holes is etched at an etching rate continuously decreasing toward the center of the hole walls. Subsequently, an activating layer of copper is applied on the surface of the substrate and on the adjacent parts of the surface of the hole walls. Copper conductors defined by a photoresist mask in a known manner, are deposited on the surface of the activating layer following the additive technique, the copper is deposited on the entire surface of the hole walls. As the maximum etching depth of the copper on the hole wall is approximately 0.2 mm maximum, and as the activating layer is applied up to a depth of approximately 1.2 mm a perfect copper overlap on the walls is ensured.

15 Claims, 3 Drawing Figures

METHOD OF RENEWING DEFECTIVE COPPER CONDUCTORS ON THE EXTERNAL PLANES OF MULTILAYER CIRCUIT BOARDS

BACKGROUND OF THE INVENTION

1. Field of Invention

The invention relates to a method of blanket re-processing multilayer circuit boards with defective external copper conductors.

2. Description of Prior Art

In the course of the miniaturization of electronic circuits, it is common to fabricate circuit boards having several layers of insulating substrate and conductive planes sandwiched together. In practice, a copper foil is laminated to an insulating substrate and a circuit pattern is subsequently defined using known photolithographic techniques. A second insulating plane is then laminated over the copper conductive plane, followed by a new copper plane for the next circuit layer. This process can continue for several different layers on either or both sides of the original circuit plane. It is not uncommon to encounter defective conductors in an external plane of the multilayer circuit board after several conductive planes have already been fabricated.

When one or two conductors are defective, it is possible to repair them using known bridging or repair techniques. However, when there are several defects in the external conductive plane or when the copper conductors are very closely spaced, these repair methods are no longer economically feasible. The only alternatives available are either to scrap the multilayer circuit board, an expensive and inefficient alternative, or re-work the external defective plane by etching off the external copper conductors and replacing them. Unfortunately, no method has been known which permits the additive metal plating of external conductors on a partially fabricated multilayer circuit board.

To successfully employ the additive metal plating process, an activating layer, e.g., a thin copper foil, must be applied on the insulating substrate as a seed on which conductors will then grow. The application of this activating or seed layer, however, has presented difficult problems. Experience has shown that it is impossible to relaminate a copper foil on an etched cured epoxide resin substrate. This would only be possible if a pre-crosslinked epoxide resin substrate were used, but even then, if through holes were present, the multilayer circuit board would have to be newly drilled, and the drills would have to hit the old holes precisely to avoid their fracturing. In the past, this has not been possible or practical so the multilayer circuit boards have been scrapped, resulting in a significant loss of time, resources and money.

Therefore, it is the object of this invention to provide an improved method according to which multilayer circuit boards with defective external copper conductors can be blanket re-processed to allow the salvage of valuable multilayer circuit boards.

It is also an object of this invention to provide a method according to which a copper activating or seed layer can be applied to a cured epoxide resin insulating substrate without the problem of delamination.

It is still another object of this invention to provide a method according to which copper plated through holes can be etched at a rate decreasing towards the center of the wall of the holes, thereby protecting the internal conductor planes.

SUMMARY OF THE INVENTION

These objects are accomplished according to the following method:

(1) Cleaning and removal of oxidic layers;

(2) Etching of copper conductors completely off the surface of the external planes of the multilayer circuit board and etching of copper off the walls of the plated through holes with an etching rate continually decreasing toward the center of the walls of the holes;

(3) Sputtering an activating layer of copper on the surface of the board and on the adjacent parts of the surface of the hole walls; and (4) Depositing copper conductors on the surface of the activating layer and walls of the plated through holes in accordance with known photolithographic methods and additive plating techniques.

DESCRIPTION OF THE PREFERRED EMBODIMENT

With reference to the drawings, the method which comprises the invention, its features and objects will now be further described.

Figure 1A:
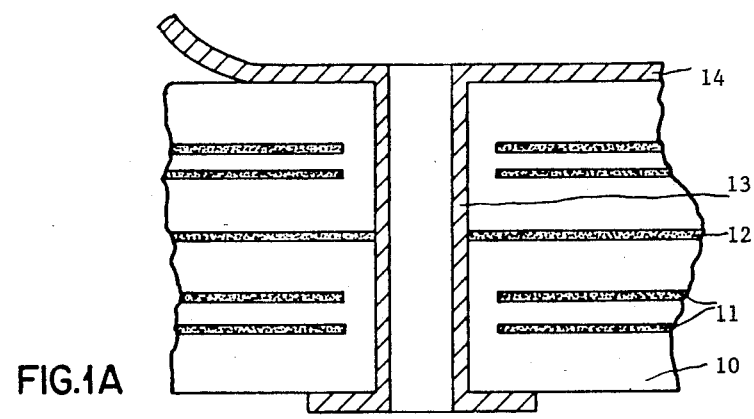
FIG. 1A is a cross-sectional view of a multilayer circuit board with a defective external conductor.

A typical multilayer circuit board (FIG. 1A) consists of an epoxide resin core or substrate 10 with conductive signal planes 11, 12 and 14. Signal plane 12 is connected to the top signal plane 14 of the multilayer circuit board via plated through hole 13. In the top layer or signal plane 14, there are copper conductors with poor adherence or other defects.

The first processing step comprises the cleaning or degreasing of the external surfaces of the multilayer circuit board, followed by removal of the copper oxidic layers present on the surfaces of the copper conductors of signal plane 14. The following procedures must be followed carefully to ensure uniform etching of the copper conductors in the later processing steps.

1. First, the multilayer circuit board is cleaned with an alkaline cleaning agent, such as sodium-m-silicate containing sodium laurylsulphate and diglycol, commercially available under the trade name Pennsalt K2. A solution containing 45 to 60 grams per liter Pensalt K2 is left to act on the multilayer circuit board for approximately two minutes at a temperature of 65° C.

2. This step is followed by a one minute rinse in stagnant deionized water, and then a rinse in flowing water, with a rate of approximately 200 liters per hour, for two minutes.

3. The copper oxide present on the surface of the copper conductors is removed with a 25 volume percent hydrochloric acid solution, followed by the rinsing procedure described in "2" above.

Figure 1B:
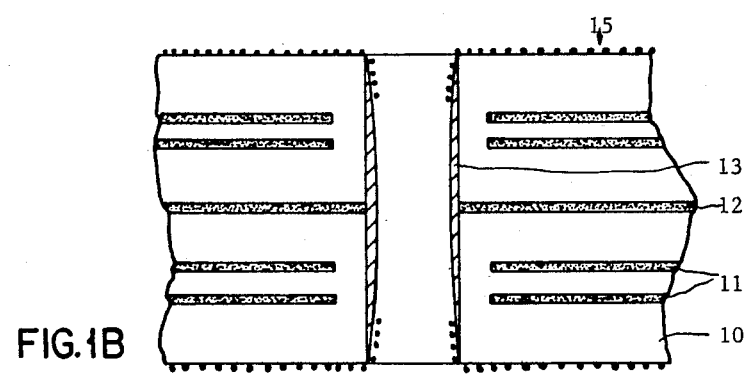
FIG. 1B is a cross-sectional view of the same multilayer circuit board after etching has been completed and the activating layer has been applied.
Figure 1C:
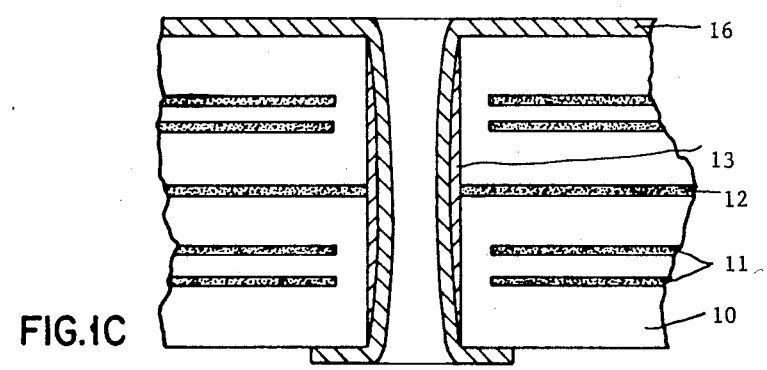
FIG. 1C is a cross-sectional view of the same multilayer circuit board following the deposition of new copper on the external surfaces and plated through holes.

The defective conductors are then etched off in a hydrochloric $CuCl_2$ bath at room temperature. The bath contains approximately 27 g/l $CuCl_2$, and 220 g/l HCL (32% by weight). During the etching process, the multilayer circuit board is oscillated in a direction orthogonal to the axis of the plated through holes and the flow of the etching bath. Furthermore, air is bubbled through the etching bath from the bottom of bath container. These procedures ensure that the etching rate of the copper on the external conductor planes is between approximately 1.5 to 2 microns per minute, while toward the center of the wall of the through hole the etching rate continuously decreases to almost zero. A copper profile at the wall of the through hole 13 is achieved as depicted in FIG. 1B. The copper remaining on the wall of the through hole 13 protects the inner conductor planes 12 against an etching attack, thus excluding the risk of an irreparable etching of the inner conductor planes 12. Etching in the hydrochloric $CuCl_2$ solution is continued until all external conductors 14 have been completely removed. Tests have revealed that the $CuCl_2$ content of the etching solution must be carefully controlled. If the etching solution contains more than 40 g/l $CuCl_2$, the etching in the through hole will be excessive, whereas with a content of less than 15 g/l, the etching rate will be too low and etching will be irregular.

Following the etching, the multilayer circuit board is rinsed in flowing deionized water and then dried in a hot air oven at approximately 80° C. The etching of the copper in the plated through holes is approximately 150 to 200 microns at the upper and lower sides of the multilayer circuit board, which corresponds to approximately half the diameter of the through holes.

The activating or seed layer 15 (FIG. 1B) for the forthcoming additive plating process is applied in a magnetron-copper sputtering system. The parameters for applying the activating layer in the system are as follows:

Vacuum: approx. $2 \times 10^{-5}$ mbar;
Partial argon pressure: $2-3 \times 10^{-3}$ mbar;
Substrate temperature: 80°–90° C. (thermo point measuring);
Substrate movement: 2–3 cm./sec. on a transport device;
Sputtering Rate: 1.0 to 1.5 nm/sec.;
Thickness of the activating layer: approx. 200 to 500 nm.

This method can be executed automatically in a continuous sputter system and both the front and the back of the multilayer circuit board can be simultaneously sputtered if two cathodes are used. With the above given parameters an aspect ratio, i.e., a ratio of the depth of the hole to the diameter of the hole of approximately 3:1 can be reached during sputtering. This means that a hole of approximately 0.4 mm diameter is copper coated during sputtering up to a depth of approximately 1.2 mm. Since the etching depth of the copper in the plated through hole amounts to 0.2 mm maximum, a perfect copper overlapping of the copper on the hole wall is ensured.

Following the application of the copper activating layer 15 (FIG. 1B), a photoresist layer is applied in a known manner, and a conductor pattern is defined with a conventional photolithographic process. The multilayer circuit board is then placed in a bath for copper-plating, wherein additional copper is deposited in the conductor regions 16 defined by the photolithographic process and on the wall of the plated through hole 13. A copper plating bath with the following parameters has been advantageously used:

pH-Value: 12.6 set with NaOH
$CuSO_4 \times 5\ H_2O$: 10.5 g/l highly pure copper salt
HCHO (37%): 3.5 ml/l as a reducing agent
NaCN: 26 mg/l as a ductility promoter
EDTA: 17.5 g/l as a complexing agent
Temperature: 53°±1° C.

Following the copper plating, the photoresist mask and the sputtered on copper in the regions where conductors are not desired are removed in a known manner.

In a wet thermal test where the multilayer circuit board is immersed in water with a temperature between 0° and 100° C., samples processed in accordance with the above method did not show any tension fissures in the copper interfaces between the pre-existing and newly-applied copper in the through holes.

With the method as disclosed by the invention, which can be practiced in a simple and well-controllable manner, a blanket re-processing of multilayer circuit boards with defective external copper conductors is presented for the first time.

While the invention has been particularly shown and described with reference to a preferred embodiment thereof, it will be understood by those skilled in the art that various changes in detail may be made therein without departing from the spirit, scope and teaching of the invention. Accordingly, the process herein disclosed is to be considered merely as illustrative, and the invention is to be limited only as specified in the claims.

We claim:

1. A method of renewing defective copper conductors on the external plane of a multilayer circuit board, comprising the following process steps:
    (1) pre-processing of the multilayer circuit board by
        (a) cleaning, and rinsing;
        (b) removing oxidic layers from the copper to be etched, and rinsing;
    (2) etching off the defective copper conductors, and etching the copper on the wall of a through hole, with an etching rate continuously decreasing toward the center of the hole wall, and rinsing;
    (3) applying an activating layer of copper on the surface of the substrate, and on the adjacent parts of the wall of the through hole; and
    (4) depositing copper conductors on the surface regions of the activating layer defined by a photoresist mask and depositing copper on the entire surface of the through hole wall.

2. The method as claimed in claim 1, wherein the multilayer circuit board is cleaned for 2 minutes at approximately 65° C. with an alkaline solution of sodium-m-silicate comprising sodium laurylsulphate and diglycol.

3. The method as claimed in claim 1 wherein the copper oxide is removed from the copper to be etched with 25 volume percent hydrochloric acid.

4. The method as claimed in claim 1 wherein the defective conductors and the copper of the boring wall of the through hole are etched with a hydrochloric $CuCl_2$ solution.

5. The method as claimed in claim 1 wherein during etching, the multilayer circuit board is oscillated in a direction perpendicular to the axis of the through hole and air is bubbled through the bath from the bottom.

6. The method as claimed in claim 4 wherein during etching, the multilayer circuit board is oscillated in a direction perpendicular to the axis of the through hole and air is bubbled through the bath from the bottom.

7. The method as claimed in any one of claims 1, 4, 5 and 6 wherein the multilayer circuit board to be etched is immersed in the hydrochloric etching bath in such a manner that the through hole is arranged orthogonal to the bath flow and to the direction of movement of the multilayer circuit board so that the copper etching rate in the through hole approaches zero toward the center of the through hole wall.

8. The method as claimed in any one of claims 1 to 6 wherein the etching takes place with the hydrochloric $CuCl_2$ solution at room temperature.

9. The method as claimed in claim 7 wherein the etching takes place with the hydrochloric $CuCl_2$ solution at room temperature.

10. The method as claimed in claim 1 wherein flowing water is used in the rinsing steps.

11. The method as claimed in claim 1 wherein the activating layer is applied on the substrate and the surface of the wall of the through hole by magnetic field-supported high rate cathode sputtering.

12. The method as claimed in claim 11 wherein the activating layer is applied with a sputter rate of 1.0 to 1.5 nm/s up to a layer thickness of 500 nm.

13. The method as claimed in any one of claims 1, 11 and 12 wherein the activating layer is applied fully automatically in a continuous system to both sides of the multilayer circuit board simultaneously through the use of two cathodes, one on the front and one on the back of the multilayer circuit board.

14. The method as claimed in any one of claims 1, 11 and 12 wherein the wall of the through hole is copper coated to an aspect ratio of approximately 3:1.

15. The method as claimed in claim 13 wherein the wall of the through hole is copper coated to an aspect ratio of approximately 3:1.

* * * * *